(12) United States Patent
Padovan et al.

(10) Patent No.: US 11,196,382 B1
(45) Date of Patent: Dec. 7, 2021

(54) OSCILLATOR WITH INDUCTOR AND PROGRAMMABLE CAPACITOR BANK

(71) Applicant: Infineon Technologies AG, Neubiberg (DE)

(72) Inventors: Fabio Padovan, Villach (AT); Matteo Bassi, Villach (AT); Giovanni Boi, Villach (AT); Dmytro Cherniak, Villach (AT); Luigi Grimaldi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/064,378

(22) Filed: Oct. 6, 2020

(51) Int. Cl.
*H03B 5/12* (2006.01)

(52) U.S. Cl.
CPC ......... *H03B 5/1265* (2013.01); *H03B 5/1228* (2013.01)

(58) Field of Classification Search
CPC .............................. H03B 5/1265; H03B 5/1228
USPC .................. 331/116 FE, 167, 177 V, 117 FE
See application file for complete search history.

(56) References Cited

U.S. PATENT DOCUMENTS

| | | | |
|---|---|---|---|
| 7,439,817 B2 | 10/2008 | Waheed et al. | |
| 8,125,285 B2 * | 2/2012 | Titus | H03L 7/093 331/177 V |
| 8,198,944 B2 | 6/2012 | Sun et al. | |
| 8,269,566 B2 * | 9/2012 | Upadhyaya | H03B 5/124 331/117 R |
| 2014/0002204 A1 | 1/2014 | Kim et al. | |
| 2014/0085012 A1 | 3/2014 | Wu et al. | |

* cited by examiner

*Primary Examiner* — Arnold M Kinkead
(74) *Attorney, Agent, or Firm* — Slater Matsil, LLP

(57) ABSTRACT

An oscillator includes: a first inductor; and a programmable capacitor bank coupled between a first terminal of the first inductor and a second terminal of the first inductor, where the programmable capacitor bank includes a plurality of cells concatenated together, where each cell of the plurality of cells includes a first node, a second node, a third node, a second inductor, and a programmable capacitor, where the second inductor is coupled between the first node and the third node, and the programmable capacitor is coupled between the third node and the second node, where a first inductance of the first inductor is larger than a sum of the inductances of the second inductors of the programmable capacitor bank.

20 Claims, 15 Drawing Sheets

OSCILLATOR WITH INDUCTOR AND PROGRAMMABLE CAPACITOR BANK

TECHNICAL FIELD

The present invention relates generally to systems and methods for oscillators.

BACKGROUND

Applications in the millimeter-wave frequency regime have gained significant interest in the past few years due to the rapid advancement in low-cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Resolution, accuracy, and sensitivity of the radar system may depend, in part, on the linearity and phase noise performance of the radar's frequency generation circuitry, which generally includes an RF oscillator (e.g., a digitally controller oscillator) and circuitry that controls the frequency of the RF oscillator.

As the operating frequencies of RF systems continue to increase, however, the generation of signals at such high frequencies poses a major challenge. There is a need in the art for digitally controlled oscillators (DCOs) with improved performance (e.g., linearity and phase noise performance).

SUMMARY

In accordance with an embodiment of the present invention, an oscillator includes: a first inductor; and a programmable capacitor bank coupled between a first terminal of the first inductor and a second terminal of the first inductor, wherein the programmable capacitor bank comprises a plurality of cells concatenated together, wherein each cell of the plurality of cells comprises a first node, a second node, a third node, a second inductor, and a programmable capacitor, wherein the second inductor is coupled between the first node and the third node, and the programmable capacitor is coupled between the third node and the second node, wherein a first inductance of the first inductor is larger than a sum of the inductances of the second inductors of the programmable capacitor bank.

In accordance with an embodiment of the present invention, an oscillator includes: a first fixed inductor; and a programmable capacitor bank coupled between a first terminal of the first fixed inductor and a second terminal of the first fixed inductor, wherein the programmable capacitor bank comprises: a first cell, wherein a first node of the first cell is coupled to the first terminal of the first fixed inductor, and a second node of the first cell is coupled to the second terminal of the first fixed inductor, wherein a second fixed inductor of the first cell is coupled between the first node of the first cell and a third node of the first cell, and a first programmable capacitor of the first cell is coupled between the third node of the first cell and the second node of the first cell; and a second cell, wherein a first node of the second cell is coupled to a first terminal of the first programmable capacitor of the first cell, and a second node of the second cell is coupled to a second terminal of the first programmable capacitor of the first cell, wherein a third fixed inductor of the second cell is coupled between the first node of the second cell and a third node of the second cell, and a second programmable capacitor of the second cell is coupled between the third node of the second cell and the second node of the second cell, wherein an inductance of the first fixed inductor is larger than a sum of a second inductance of the second fixed inductor and a third inductance of the third fixed inductor.

In accordance with an embodiment of the present invention, a method of operating a digitally controlled oscillator (DCO) includes: receiving a thermometer-coded word indicating a capacitance value for the DCO; and enabling or disabling each programmable capacitor in a programmable capacitor bank of the DCO in accordance with a respective bit in the thermometer-coded word, wherein the DCO comprises a first fixed inductor and the programmable capacitor bank coupled between a first terminal of the first fixed inductor and a second terminal of the first fixed inductor, wherein the programmable capacitor bank comprises a plurality of cells concatenated together, wherein each cell of the plurality of cells comprises a first node, a second node, a third node, a second fixed inductor, and a programmable capacitor, wherein in each cell, the second fixed inductor is coupled between the first node and the third node, and the programmable capacitor is coupled between the third node and the second node, wherein an inductance of the first fixed inductor is larger than a sum of the inductances of the second fixed inductors in the programmable capacitor bank.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Throughout the discussion herein, unless otherwise specified, the same or similar numerals in different figures refer to the same or similar component.

The present invention will be described with respect to example embodiments in a specific context, namely digitally controlled oscillators (DCOs) with a programmable capacitor bank having a plurality of cells, where each of the cells has an inductor and a programmable capacitor.

In direct Frequency and Phase Modulation (FM) applications, the linearity of the digitally controlled oscillator (DCO) directly impacts the performance and complexity of the FM-system. For example, in communication applications, DCO nonlinearity produces unwanted spectral regrow and Error Vector Magnitude (EVM) degradation. In Frequency-Modulated Contentious Wave (FMCW) applications, DCO non-linearity results in range/velocity/angle measurement uncertainty as well as unwanted spurious content (e.g., ghost targets).

In FMCW radar applications, an ideal output frequency of the DCO should be a linear ramp over time. However, the characteristics of the generated frequency versus the digital control word (e.g., a control word indicating a capacitance of the LC circuit) for the DCO can be strongly nonlinear, and the non-linearity may result from the topology and physics of the capacitors used in the DCO. Moreover, the natural frequency of an LC circuit is $\omega=1/\sqrt{LC}$, therefore, even if the capacitor C can change linearly with time, the characteristic of the frequency generated is still subject to the square root law.

Pre-distortion processing is usually performed for conventional DCO in order to achieve improved linear relationship between the digital control word and the output frequency of the DCO. The pre-distortion, however, may require extensive DCO characteristics measurements and complicated compensation mechanism, which may increase the complexity and calibration time of the DCO. Phase lock loop (PLL) may also be used to improve the linearity of the conventional DCO by using a feedback loop. However, the feedback linearization method may only be effective when the modulation rate for the DCO is significantly lower than the PLL loop bandwidth. The present disclosure discloses various embodiments of DCO that can achieve substantially linear relationship between the digital control word of the DCO and the output frequency of the DCO without the need for the pre-distortion processing or a phase lock loop.

Figure 1:
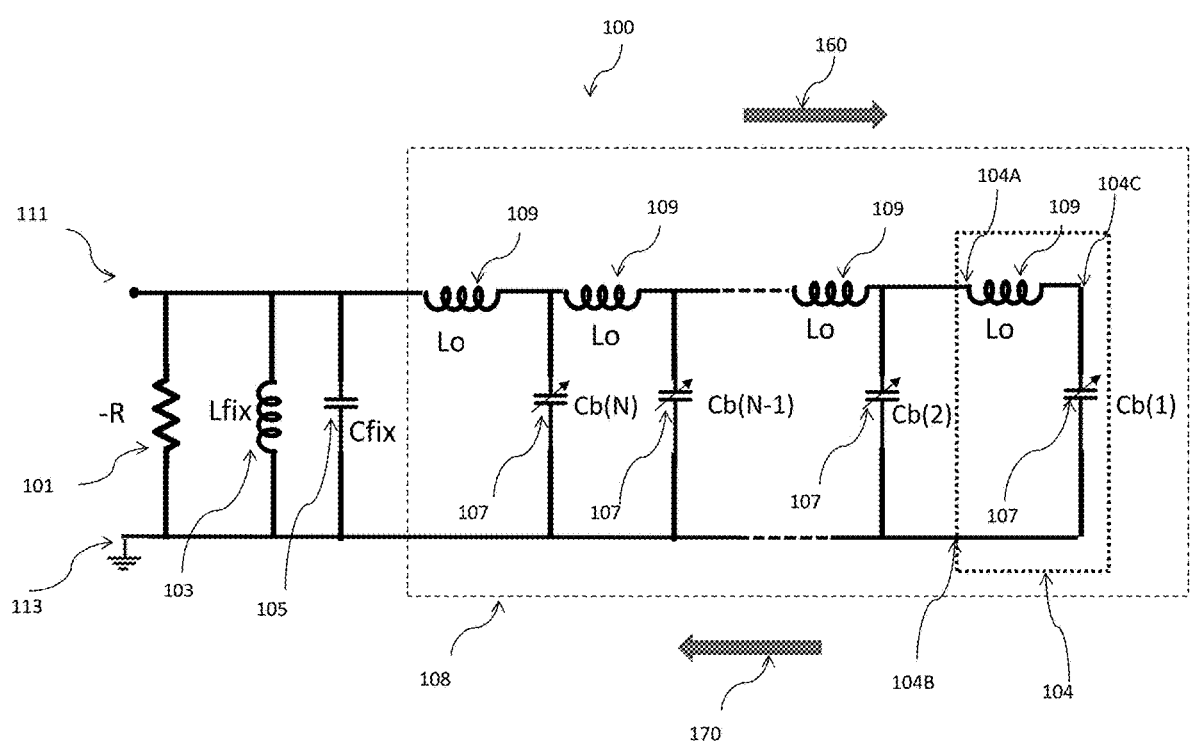
FIG. 1 illustrates a schematic diagram of a digitally controlled oscillator (DCO), in an embodiment.

FIG. 1 illustrates a schematic diagram of a digitally controlled oscillator (DCO) 100, in an embodiment. The DCO 100 includes an inductor 103 and a capacitor 105 coupled in parallel. In some embodiments, the capacitor 105 is optional, and therefore, is omitted. Various embodiments disclosed herein include the capacitor 105, with the understanding that the capacitor 105 may be omitted. The DCO 100 further includes a programmable capacitor bank 108 coupled between terminals of the inductor 103. The output terminals 111 and 113 of the DCO 100 are coupled to the terminals of the capacitor 105 (or terminals of the inductor 103). In the example of FIG. 1, the DCO 100 further includes an active device 101 (e.g., a transistor) coupled between the output terminals 111 and 113. The active device 101 may be used for maintaining oscillation of the DCO 100 by injecting energy into the LC tank circuit formed by the inductor 103, the capacitor 105 (if present), and the programmable capacitor bank 108. Therefore, a label of negative resistance (e.g., −R) is used in FIG. 1 to indicate that device 101 is an active device.

In the illustrated embodiments, the inductor 103 is a fixed inductor, and the capacitor 105 is a fixed capacitor. Note that throughout the description herein, a fixed electrical component (e.g., a fixed inductor or a fixed capacitor) refers to an electrical component that has been manufactured to have a fixed nominal value (e.g., a nominal inductance value or a nominal capacitance value) and not intended to be used a programmable device. Although the capacitor 105 is illustrated as a fixed capacitor in the disclosed embodiments, a programmable capacitor may also be used as the capacitor 105, these and other variations are fully intended to be included within the scope of the present disclosure. Throughout the discussion herein, the term "programmable" and the term "variable" may be used interchangeably.

Still referring to FIG. 1, the programmable capacitor bank 108 includes a plurality of cells 104 (may also be referred to as capacitor cells) concatenated together to form a ladder-shaped topography. Each of the cells 104 includes an inductor 109 (e.g., a fixed inductor) and a programmable capacitor 107. The inductor 109 is coupled between a node 104A and a node 104C of the cell 104, and the programmable capacitor 107 is coupled between the node 104C and a node 104B of the cell 104. As illustrated in FIG. 1, the programmable capacitors 107 are disposed along the rungs of the ladder-shaped topography, and the inductors 109 are disposed along the beam of the ladder-shaped topography.

As illustrated in FIG. 1, the inductor 103 is separate from the inductors 109. In other words, the inductor 103 is an electrical device that is separate from the inductors 10, which inductors 109 may be a plurality of other electrical devices. In some embodiments, the programmable capacitor bank 108 is arranged besides (e.g., adjacent to) the inductor 103 in an integrated circuit (IC). For example, the inductor 103 may be formed in a first area of a substrate of the IC, and the programmable capacitor bank 108 may be formed in a second area of the substrate adjacent to the first area. The programmable capacitor bank 108 is configured to improve linearity characteristics of the DCO 100, details of which are discussed hereinafter, in some embodiments.

In the example of FIG. 1, the cells 104 in the programmable capacitor bank 108 are the same (e.g., having the same structure and same parameters for the electrical components in the cells). In other words, the inductors 109 (e.g., fixed inductors) of the cells 104 have a same inductance value (e.g., an inductance value of Lo), and the programmable capacitors 107 of the cells 104 have the same programmable values (e.g., same maximum capacitance values and same minimum capacitance values). For example, each of the programmable capacitors 107 may have two different capacitance values (e.g., a maximum capacitance value and a minimum capacitance value), depending on, e.g., the control signal used to set (e.g., program) the programmable capacitors 107, each of the programmable capacitors 107 has either the maximum capacitance value or the minimum capacitance value. Note that each of the programmable capacitors 107 is controlled (e.g., programmed, or set) individually, e.g., by a different bit of a digital control word, details of which are discussed hereinafter with reference to FIG. 5.

The number of cells 104 in the programmable capacitor bank 108 may depend on the design of the DCO 100 and may be any suitable number. For example, the number of cells 104 in the programmable capacitor bank 108 may be between about 50 and about 5000, such as about 600. As discussed below with reference to FIGS. 2 and 3, the inductors 109 in the programmable capacitor bank 108 are used to improve the linearity characteristics of the DCO, and therefore, the inductance of each inductor 109 is much smaller than the inductance of the inductor 103 to not affect the frequency of the DCO in any significant way (e.g., change the frequency by less than 10%). In some embodiments, an inductance of the inductor 103 is larger than a sum of the inductances of all of the inductors 109 in the programmable capacitor bank 108. In some embodiments, the inductance of the inductor 103 is between about 5 times and about 500 times of the sum of the inductances of all of the inductors 109 in the programmable capacitor bank 108. Therefore, the inductor 103 may also be referred to as a main inductor.

As illustrated in FIG. 1, for two adjacent cells 104 in the programmable capacitor bank 108, the nodes 104A and 104B of the cell 104 on the right are coupled to terminals of the programmable capacitor 107 of the cell 104 on the left. The nodes 104A and 104B of the leftmost cell 104 in FIG. 1 (which may be referred to as the cell closest to the inductor 103) are coupled to terminals of the inductors 103. To facilitate subsequent discussion, the first cell 104 from the right-hand side in FIG. 1 (also referred to as the cell furthest from the inductor 103) may be referred to as the first cell 104 of the programmable capacitor bank 108, and the programmable capacitor 107 in the first cell 104 is denoted as Cb(1). Similarly, the second cell 104 from the right-hand side in FIG. 1 may be referred to as the second cell 104 of the programmable capacitor bank 108, and the programmable capacitor 107 in the second cell 104 is denoted as Cb(2), and so on. The leftmost cell 104 in FIG. 1 may be referred to as the last cell of the programmable capacitor bank 108, and the programmable capacitor 107 in the last cell 104 is denoted as Cb(N). In addition, the capacitance of the capacitor 105 (e.g., a fixed capacitor) is denoted as Cfix, and the inductance of the inductor 103 (e.g., a fixed inductor) is denoted as Lfix. Note that in the discussion herein, unless specifically defined, terms such as "first cell," "second cell," and "last cell" are used to identify cells 104 disposed sequentially along a certain direction being discussed. For example, the "first cell," "second cell," and "last cell" discussed above refer to cells 104 disposed along the direction 170 (e.g., from right to left in FIG. 1). When the direction being discussed is reversed, the cells 104 referred to by "first cell," "second cell", and "last cell" change accordingly. For example, if the direction being discussed is along the direction 160, then the cells 104 referred to by "first cell," "second cell", and "last cell" correspond to cells 104 with programmable capacitors 107 labeled as Cb(N), Cb(N−1), and Cb(1), respectively.

Figure 2A:
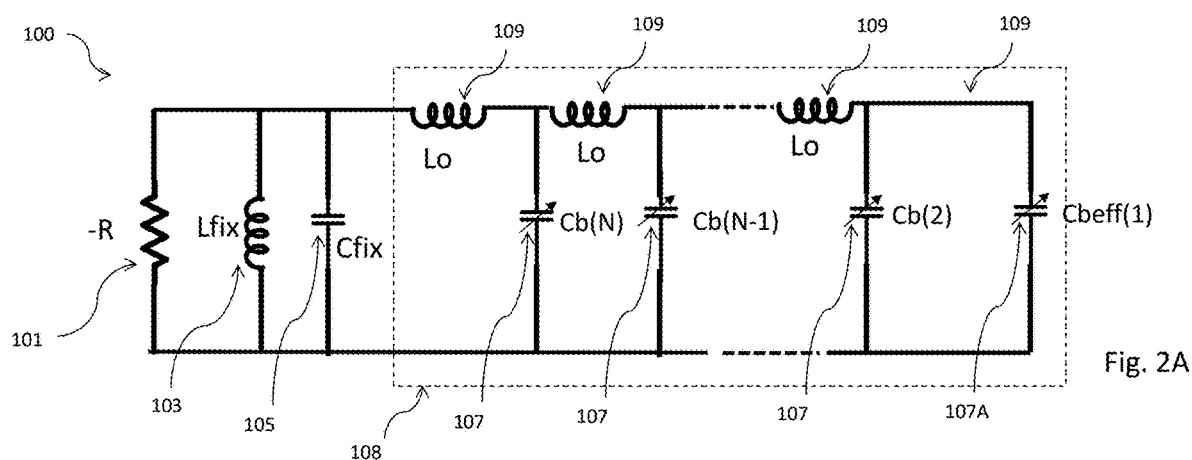
FIGS. 2A and 2B illustrate simplified schematic diagrams of the DCO of FIG. 1 at various stages of simplification, in an embodiment.
Figure 2B:
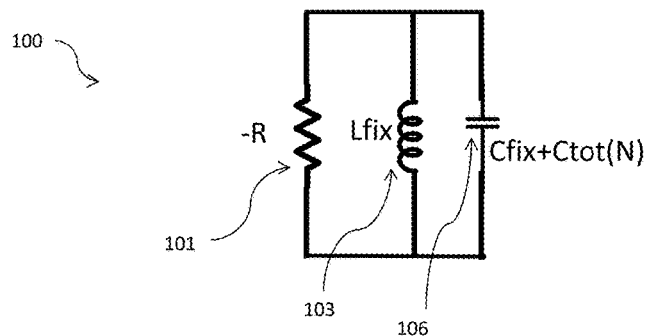

FIGS. 2A and 2B illustrate simplified schematic diagrams of the DCO 100 of FIG. 1 at various stages of simplification, in an embodiment. FIGS. 2A and 2B help to understand the equations below for calculating the total capacitance of the LC tank circuit of the DCO.

In FIG. 2A, the schematic of DCO 100 in FIG. 1 is simplified by replacing the first cell 104 with an equivalent capacitor denoted as Cbeff(1), where $$C_{beff}(1) = \frac{C_b(1)}{1 - \omega_{fix}^2 L_o C_b(1)} \qquad (1)$$

$$\omega_{fix}^2 = \frac{1}{L_{fix} C_{fix}} \qquad (2)$$

where Lo, Cb(i) and $\omega_{fix}$ are chosen such that $$\omega_{fix}^2 \ll \frac{1}{L_o C_b(i)}, \text{ for } i = 1, 2, \ldots, N,$$

and where N is the total number of cells 104 in the programmable capacitor bank 108.

By treating the capacitor Cb(2) and the capacitor Cbeff(1) as one capacitor having a capacitance of Cb(2)+Cbeff(1), the equivalent capacitance for the second cell 104 can be calculated using an equation similar to (1). The above analysis can be performed recursively to calculate the equivalent capacitance of each cell, and the total capacitance Ctot(j), which is the sum of the equivalent capacitances of the cells from the first capacitance cell to the j-th capacitance cell, is given by:

$$C_{tot}(j) = \sum_{i=1}^{j} \frac{C_b(i) + C_{tot}(i-1)}{1 - \omega_{fix}^2 L_o (C_b(i) + C_{tot}(i-1))} \qquad (3)$$

where Ctot(i)=0 for i≤0. Note that with the above notations, $C_{tot}(1) = C_{beff}(1)$.

FIG. 2B illustrates the simplified schematic of FIG. 1, where the capacitor 105 and the programmable capacitor bank 108 are replaced with a capacitor 106 with an equivalent capacitance of Cfix+Ctot(N), where Ctot(N) is the equivalent capacitance of the programmable capacitor bank 108. The output frequency (e.g., frequency of the output signal) of the DCO 100 of FIG. 2B is therefore:

$$f_o = \frac{1}{2\pi \sqrt{L_{fix}(C_{fix} + C_{tot}(N))}} \qquad (4)$$

Note that for embodiments where the capacitor 105 is omitted, equation (4) may still be used by setting Cfix to zero. From equations (1)-(4), it is seen that the weight of the programmable capacitor Cb(i) is different in Ctot(N) for each cell 104, and the difference in weight can be adjusted to achieve a substantially linear characteristics for the DCO. In addition, note that the equivalent capacitance Ctot(N) of the programmable capacitor bank 108 contains polynomial terms, which compensates the square root law of the output frequency. With the proper choice of Lo, the frequency characteristic of the DCO 100 can be controlled to approach an ideal linear response. For example, given a target linear relationship between the output frequency of the DCO 100 and a digital control word for the capacitance value Ctot(N), and assuming that Lfix, Cfix, and the programmable capacitance values for Cb(i) are known, the inductance value Lo for the inductors 109 can be calculated using equations (1)-(4).

In some embodiments, the inductance Lfix of the inductor 103 (e.g., a fixed inductor) has a value between about 50 pH and about 1 nH (e.g., 50 pH<Lfix<1 nH). The inductor 109 (e.g., a fixed inductor) of each cell 104 has an inductance L less than about Lfix/50 (e.g., 0<Lo<Lfix/50), in some embodiments. The capacitance Cb(i) of the programmable capacitor 107 in each cell 104 has a value between about 0.1 fF and about 100 fF (e.g., 0.1 fF<Cb(i)<100 fF), and the equivalent capacitance Ctot(N) of the programmable capacitor bank 108 is between about 50 fF and 5 pF (e.g., 50 fF<Ctot(N)<5 pF), in some embodiments.

Figure 3:
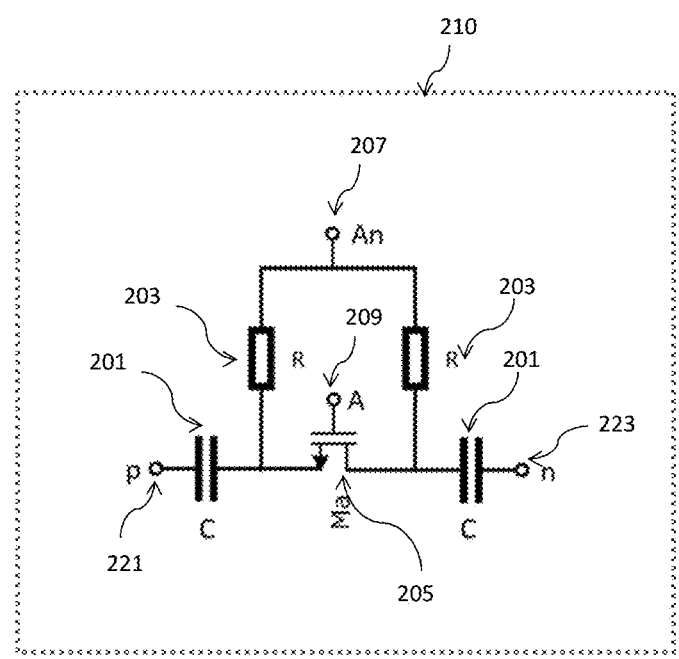
FIG. 3 illustrates a schematic diagram of a programmable capacitor, in an embodiment.

FIG. 3 illustrates a schematic diagram of a programmable capacitor 210, in an embodiment. The programmable capacitor 210 is an embodiment programmable capacitor that can be used as the programmable capacitor 107 in FIG. 1.

Referring to FIG. 3, the programmable capacitor 210 has two terminals 221 and 223 for connection with other electrical components or circuits. The programmable capacitor 210 includes two fixed capacitors 201 coupled between the terminals 221 and 223, and includes a switch 205 (e.g., a transistor) coupled between the fixed capacitors 201. In the example of FIG. 3, the switch 205 is a transistor, and the source/drain terminals of the transistor 205 are coupled to the fixed capacitors 201, and a gate of the transistor 205 is coupled to a node 209, which is configured to be connected to a control voltage A. FIG. 3 further illustrates resistors 203 coupled between the source/drain terminals of the transistor 205 and a node 207, which node 207 is configured to be connected to a control voltage An, where An is an inverse of the control voltage A. In other words, if the control voltage A is a logic high signal (e.g., +3V, or +5V), then the control voltage An is a logic low signal (e.g., electrical ground), and vice versa. The inverse control voltages A and An ensure that the transistor 205 is switched ON and OFF properly.

In the illustrated embodiment of FIG. 3, the fixed capacitors 201 have a same capacitance C, which may be, e.g., between about 0.2 fF and about 200 fF. The resistors 203 have a same resistance R, and are properly sized to bias the source/drain terminals of the transistor 205 and to set a DC point. The resistance R of the resistors 203 is chosen to be high enough to prevent electrical short of the source/drain terminals of the transistors 205. A typical value for the resistance R is between about 1000Ω and about 100 KΩ, as an example.

Still referring to FIG. 3, when the control voltage A is logic high, the transistor 205 is turned ON, and the programmable capacitor 210 has a capacitance Cmax, which is C/2. When the control voltage A is logic low, the transistor 205 is turned OFF, and the programmable capacitor 210 has a capacitance Cmin, which has a very small value and is dominated by the parasitic capacitance of the transistor wiring. For example, Cmin may be between about 0.01 fF and about 50 fF.

Figure 4:
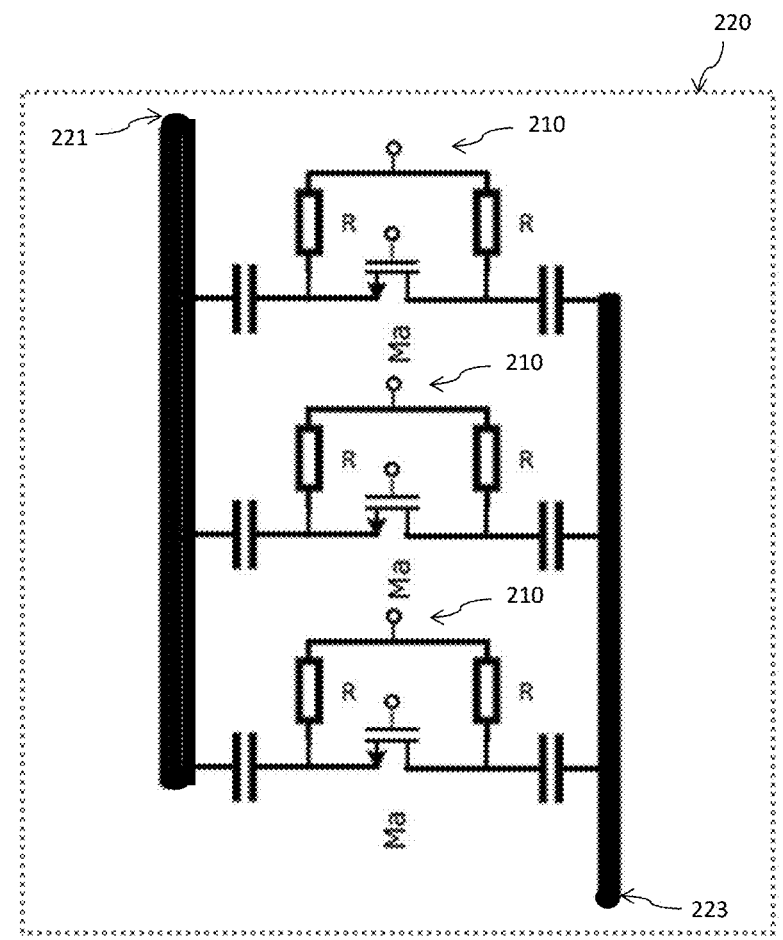
FIG. 4 illustrates a schematic diagram of a programmable capacitor, in another embodiment.

FIG. 4 illustrates a schematic diagram of a programmable capacitor 220, in another embodiment. The programmable capacitor 220 is another embodiment programmable capacitor that can be used as the programmable capacitor 107 in FIG. 1.

As illustrated in FIG. 4, the programmable capacitor 220 has terminal 221 and 223 for connection with other electrical components or circuits. A plurality of programmable capacitors 210 illustrated in FIG. 3 are coupled in parallel between the terminals 221 and 223. The plurality of programmable capacitors 210 are controlled by a same control voltage (see, e.g., control voltage A in FIG. 3), in some embodiments. In some embodiments, each of the plurality of programmable capacitors 210 is controlled by a separate control voltage (e.g., three control bits are used to control the three capacitors 210 in FIG. 4). Although three programmable capacitors 210 are illustrated in FIG. 4, the programmable capacitor 220 may include any number of programmable capacitors 210, such as two, or more than three. Compared with the programmable capacitor 210 in FIG. 3, the programmable capacitor 220 of FIG. 4 provides increased frequency resolution for the output frequency of the DCO 100, where the frequency resolution refers to the difference in output frequency when the digital control word of the DCO increases by 1.

Figure 5:
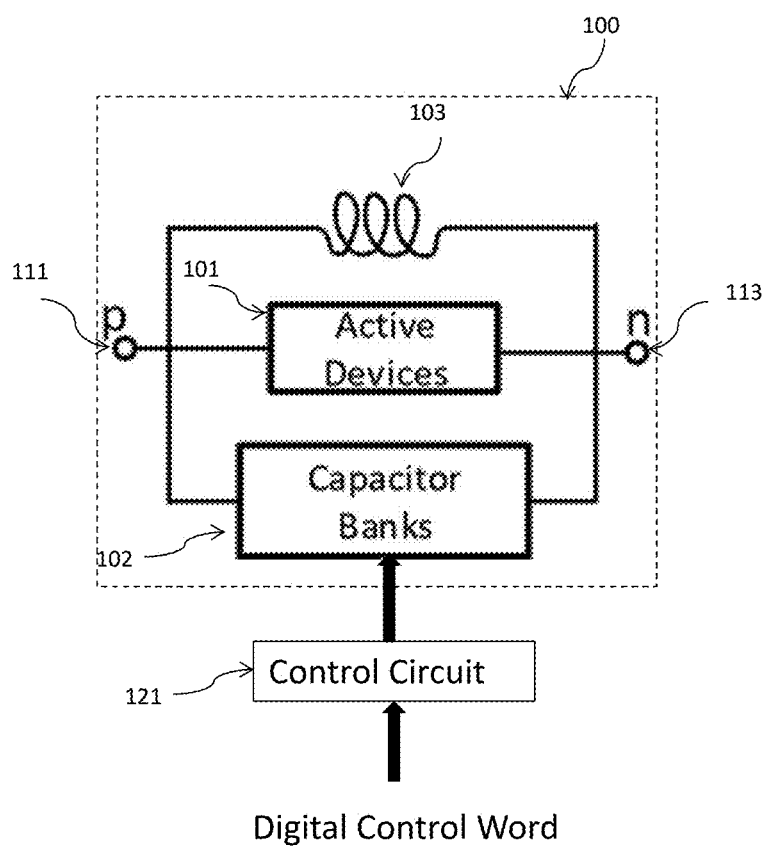
FIG. 5 is a block diagram illustrating operation of a digitally controlled oscillator, in an embodiment.

FIG. 5 is a block diagram illustrating operation of the digitally controlled oscillator (DCO) 100, in an embodiment. Note that for simplicity, the capacitor 105 and the programmable capacitor bank 108 in FIG. 1 are combined and represented as a capacitor bank 102 in FIG. 5. In FIG. 5, the DCO 100 is coupled to a control circuit 121, which accepts a digital control word of the DCO that indicates, e.g., the value of the total capacitance Ctot(N) of the programmable capacitor bank 108 (see FIG. 1). In some embodiments, the control circuit 121, which may also be referred to as a decoder circuit, converts (e.g., decodes) the values of the digital control word into a plurality of control bits, where each control bit indicates the control voltage A (see, e.g., FIG. 3) for a respective programmable capacitor, e.g., a bit of "1" indicates a logic high control voltage A, and a bit of "o" indicates a logic low control voltage A. The control circuit 121 may also include driver circuits to convert each of the decoded control bits into a corresponding control voltage (e.g., control voltage A/An) for connection to, e.g., the nodes 207/209 in FIG. 3.

In some embodiments, the digital control word is coded using a thermometer code, and therefore, is also referred to as a thermometer-coded digital control word, or a thermometer-coded word. For example, a value of zero is coded as "0," a value of 1 is coded as "10," a value of 2 is coded as "110," a value of 3 is coded as "1110," and so on. A thermometer-coded digital control word may be used to control the programmable capacitors 107 conveniently. For example, the first bit in a thermometer code may be used to enable (e.g., turning ON transistor 205) or disable (e.g., turning OFF transistor 205) the programmable capacitor 107 in the first cell 104, and the second bit in the thermometer code may be used to enable or disable the programmable capacitor 107 in the second cell 104, and so on.

Figure 6A:
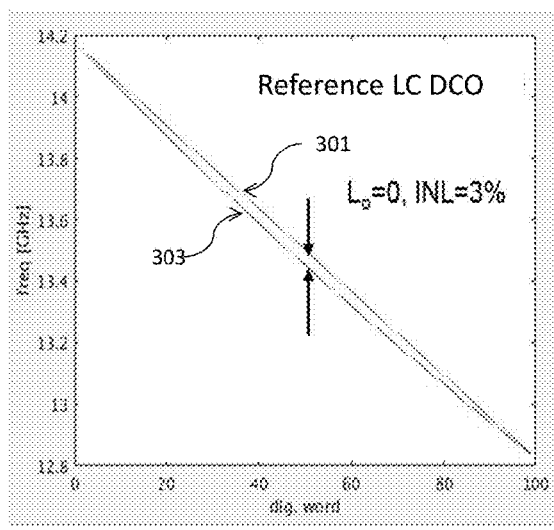
FIGS. 6A and 6B illustrate linearity characteristics of a reference DCO and an embodiment DCO, respectively, in an embodiment.
Figure 6B:
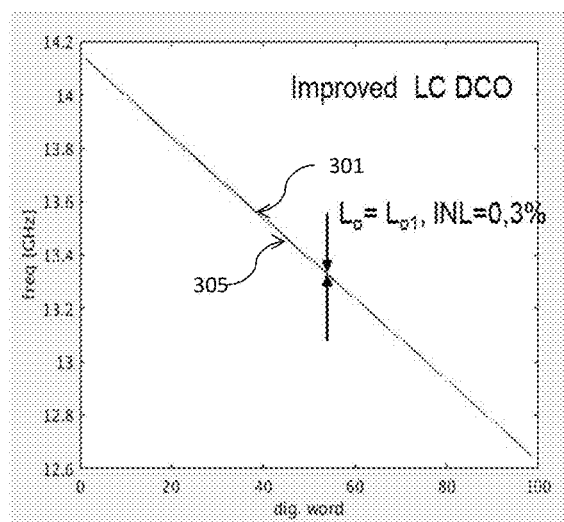

FIGS. 6A and 6B illustrate linearity characteristics of a reference DCO and the DCO 100, respectively, in an embodiment. The reference DCO is similar to the DCO 100, but with the inductor 109 in each cell 104 removed (e.g., Lo=0). The x-axis in each of FIGS. 6A and 6B illustrates the values of the thermometer-coded digital control word for the DCO 100, and the y-axis illustrates the output frequency of the DCO. In FIGS. 6A and 6B, the curve 301 shows an ideal linear relationship between the values of the digital control word and the output frequency, the curve 303 shows the output frequency of the reference DCO, and the curve 305 shows the output frequency of the DCO 100. FIG. 6A show that a maximum value for the integral nonlinearity (INL) of the linearity characteristics of the reference DCO is about 3% of the tuning range. In contrast, FIG. 6B shows that a maximum value for the integral nonlinearity (INL) of the linearity characteristics of the DCO 100 is about 0.3%, which is an order of magnitude better than that of the reference DCO. Due to its excellent linearity, the curve 305 overlaps with the curve 301.

Figure 7:
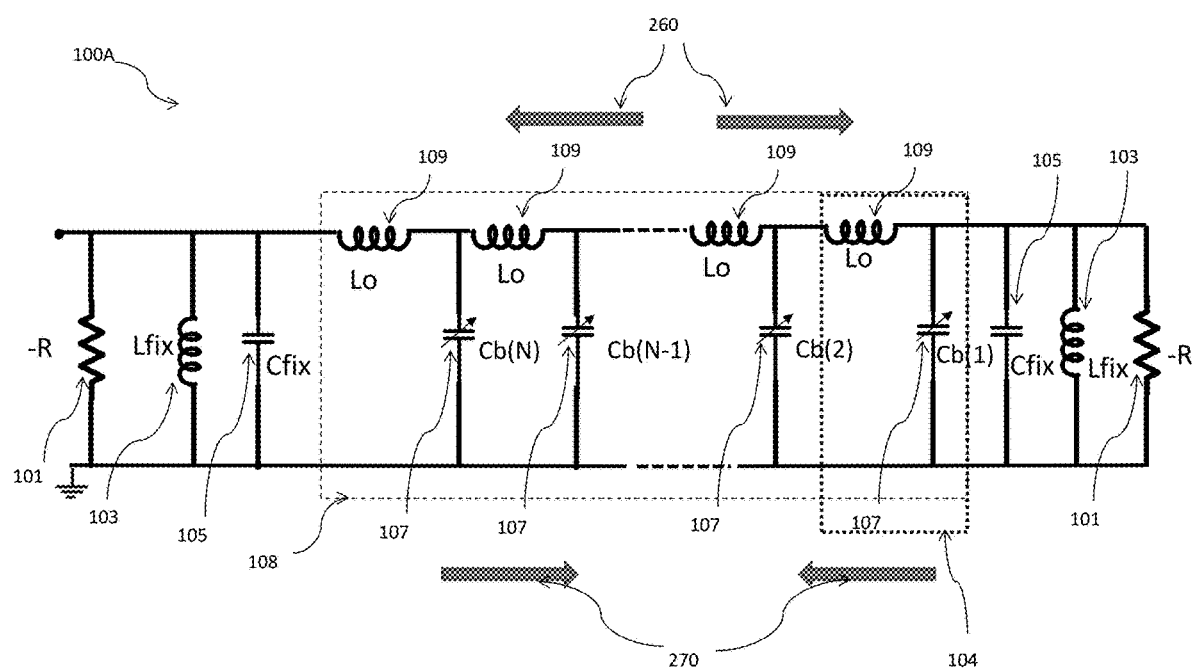
FIG. 7 illustrates a schematic diagram of a dual-coil digitally controlled oscillator (DCO), in an embodiment.

FIG. 7 illustrates a schematic diagram of a dual-coil digitally controlled oscillator (DCO) 100A, in an embodiment. The dual-coil DCO 100A is similar to the DCO 100 of FIG. 1, but with the programmable capacitor bank 108 shared by two DCO cores, where the first DCO core includes the active device 101, the inductor 103 and the capacitor 105 on the left-hand side of FIG. 7, and the second DCO core includes the active device 101, the inductor 103 and the capacitor 105 on the right-hand side of FIG. 7. Note that the capacitors 105 in FIG. 7 may be optional, and may be removed together. Compared with the DCO 100, the dual-coil DCO 100A has improved phase noise performance and improved frequency resolution. For example, by sharing one single programmable capacitor bank 108 with two coils in parallel, the frequency resolution of the DCO 100A is doubled compared to the DCO 100. In some embodiments, the equations (1)-(3) discussed above are modified for the dual-coil DCO 100A, with Lfix replaced by Lfix/2 and Cfix replaced by 2×Cfix.

Figure 8A:
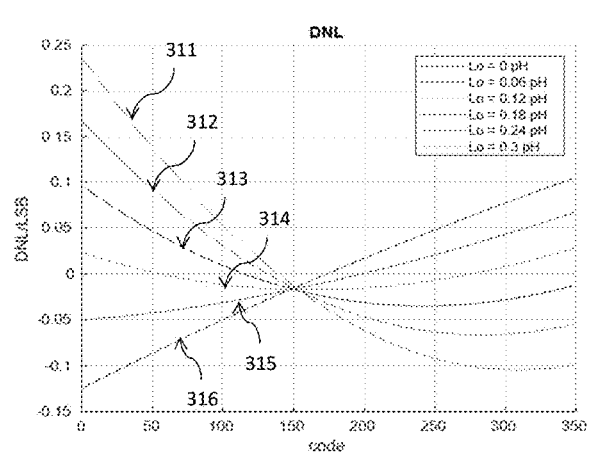
FIGS. 8A and 8B illustrate linearity characteristics of the dual-coil DCO of FIG. 7, in an embodiment.
Figure 8B:
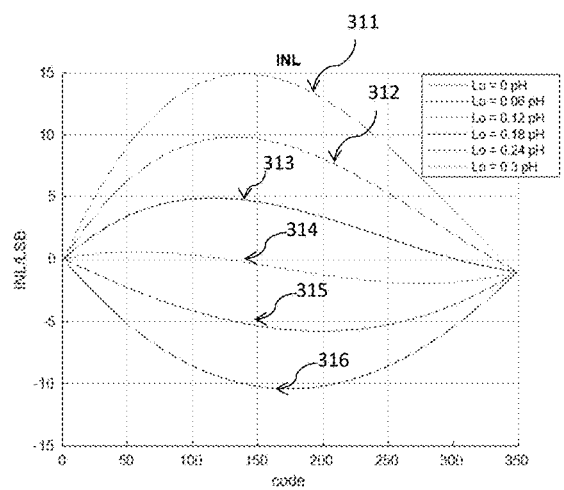

FIGS. 8A and 8B illustrate linearity characteristics of the dual-coil DCO 100A of FIG. 7, in an embodiment. FIG. 8A illustrates the differential nonlinearity (DNL) of the dual-coil DCO 100A, and FIG. 8B illustrates the integral non-linearity (INL) of the dual-coil DCO 100A. The x-axis shows the value of the digital control word, and the y-axis shows the normalized DNL or INL. In FIGS. 8A and 8B, six curves 311, 312, 313, 314, 315 and 316, each with a different inductance value Lo for the inductor 109, are illustrated, where the different inductance values Lo corresponding to the six curves are 0 pH, 0.06 pH, 0.12 pH, 0.18 pH, 0.24 pH, and 0.3 pH, respectively. In the example of FIGS. 8A and 8B, the inductance value L of 0.12 pH gives the best DNL and INL performance among all the curves shown.

Due to the inductors 109 in the cells 104, the linearity characteristics of the disclosed DCOs vary with the direction along which the programmable capacitors 107 are set (e.g., enabled or disabled). For ease of discussion, the direction along which the programmable capacitors 107 are set is also referred to the direction of enablement for the programmable capacitors 107. For example, in FIG. 1, arrows illustrate two directions of enablement 160 and 170 for the programmable capacitors 107 (labeled as Cb(1), Cb(2), . . . , Cb(N)) in the DCO 100. In the discussion herein, a direction of enablement (e.g., 160/170 in FIG. 1, or 260/270 in FIG. 7) may also be referred to as a capacitor enabling direction. When a digital control word (see FIG. 5) is received, the control circuit 121 may, based on the control bit for each of the programmable capacitors 107, set (e.g., enable or disable) each of the programmable capacitors 107 sequentially along the direction 160 or 170. For example, the programmable capacitors 107 may be sequentially set along the direction 170, such that the programmable capacitor Cb(1) is set first, then Cb(2) is set, and so on. Conversely, the programmable capacitors 107 may be sequentially set along the direction 160, such that the programmable capacitor Cb(N) is set first, then Cb(N−1) is set, and so on. For the embodiment of FIG. 4, where each programmable capacitor 220 comprises a plurality of programmable capacitors 210 coupled in parallel, the plurality of programmable capacitors 210 are set (e.g., enabled or disabled) sequentially, e.g., from top to bottom, or from bottom to top, in accordance with the direction of enablement (see 160/170 in FIG. 1) used.

In some embodiments, the direction of enablement for the programmable capacitors 107 of the dual-coil DCO 100A are different from that of the DCO 100. Referring back to FIG. 7, the arrows illustrate two directions of enablement 260 and 270. If the direction of enablement 270 is used to set (e.g., enable or disable) the programmable capacitors 107 of the dual-coil DCO 100A, the programmable capacitors 107 are set sequentially from both ends (e.g., a left end and a right end) of the programmable capacitor bank 108 toward a middle section of the programmable capacitor bank 108, where "both ends" refer to a left end (e.g., the leftmost cell comprising Cb(N)) and a right end (e.g., the rightmost cell comprising Cb(i)) of the programmable capacitor bank 108 in FIG. 7. In particular, the programmable capacitors Cb(i) and Cb(N) are set simultaneously first. Next, the programmable capacitors Cb(2) and Cb(N−1) are set simultaneously, and so on, until all the programmable capacitors 107 are set. Note that if the total number N of programmable capacitors 107 in the programmable capacitor bank 108 is an even number, e.g., N=2M, then it takes M sequential steps to set all of the programmable capacitors 107, with each step setting two programmable capacitors 107 simultaneously. If N is an odder number, e.g., N=2M+1, then after M sequential steps (where each step sets two programmable capacitors 107 simultaneously), the M+1 step sets the remaining programmable capacitor 107 (e.g., Cb(M+1)) in the middle section of the capacitor bank.

Conversely, if the direction of enablement 260 is used to set (e.g., enable or disable) the programmable capacitors 107 of the dual-coil DCO 100A, the programmable capacitors 107 are set sequentially from a middle section of the programmable capacitor bank 108 toward both ends of the programmable capacitor bank 108. For example, if N is an odd number (e.g., N=2M+1), then the first step sets the programmable capacitor 107 (e.g. Cb(M+1)) in the middle section of the programmable capacitor bank 108, then for the subsequent M steps, each step sets two programmable capacitors 107 simultaneously. For example, the second step sets the programmable capacitors labeled Cb(M) and Cb(M+2), and so on. If the N is an even number (e.g., N=2M), then M steps are performed sequentially, with each step setting two programmable capacitors simultaneously. For example, the first step sets programmable capacitors Cb(M) and Cb(M+1) in the middle section, and the second step sets programmable capacitors Cb(M−1) and Cb(M+2), and so on. For the embodiment of FIG. 4, where each programmable capacitor 220 comprises a plurality of programmable capacitors 210 coupled in parallel, the plurality of programmable capacitors 210 are set (e.g., enabled or disabled) sequentially, e.g., from top to bottom, or from bottom to top, in accordance with the direction of enablement 260 or 270 used.

Figure 9A:
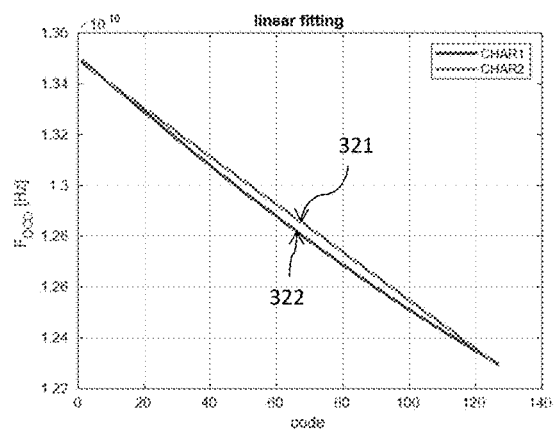
FIGS. 9A, 9B, and 9C illustrate simulated linearity characteristics of a DCO along two different directions for enabling the programmable capacitors in the DCO, in an embodiment.
Figure 9B:
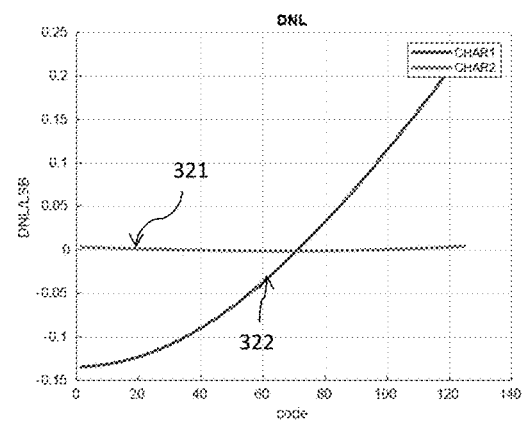
Figure 9C:
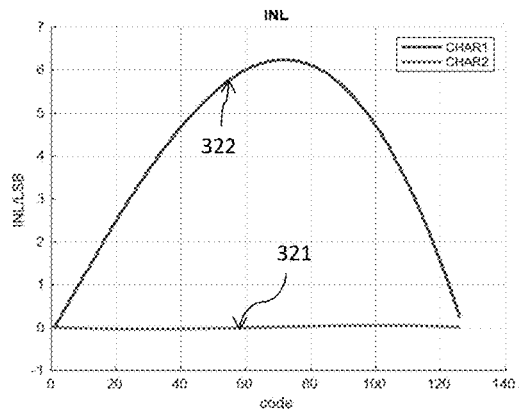

Simulation results (e.g., using computer programs) and measurements from a test chip with the disclosed DCO (e.g., 100) confirm that the linearity characteristics are different for different directions of enablement for the programmable capacitors 107. FIGS. 9A, 9B, and 9C illustrate simulated linearity characteristics of the DCO 100 along two different directions of enablement for the programmable capacitors 107, in an embodiment. FIG. 9A shows the output frequency of the DCO versus the digital control word. FIGS. 9B and 9C show the DNL and INL performance, respectively. The curves 321 and 322 correspond to the two different directions of enablement 160 and 170 (see FIG. 1), respectively.

It is seen that the direction of enablement corresponding to the curve 321 provides better linearity characteristics.

Figure 10A:
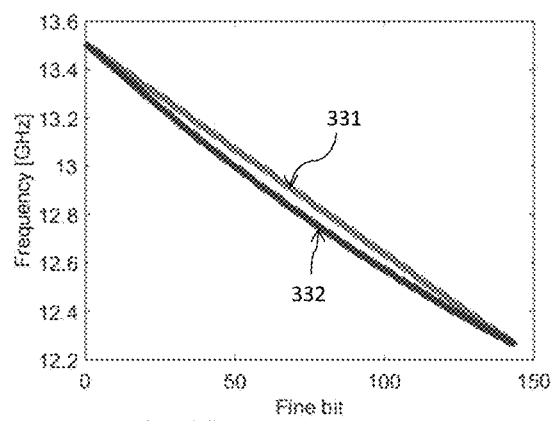
FIGS. 10A, 10B, and 10C illustrate measured linearity characteristics of a DCO along two different directions for enabling the programmable capacitors in the DCO, in an embodiment.
Figure 10B:
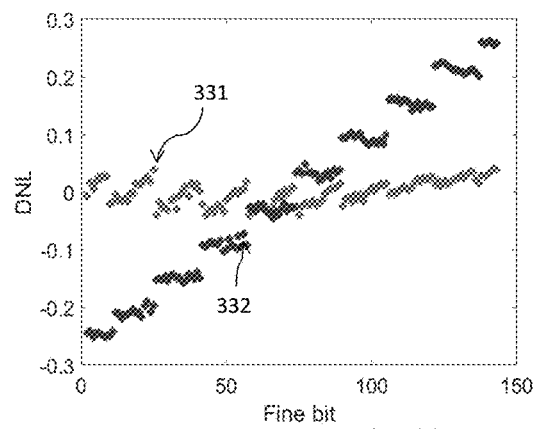
Figure 10C:
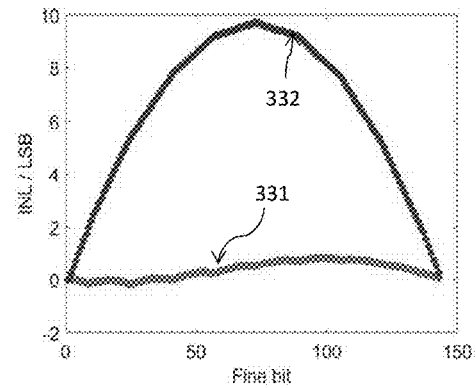

FIGS. 10A, 10B, and 10C illustrate measured (e.g., using a test chip) linearity characteristics of the DCO 100 along two different directions of enablement for the programmable capacitors 107, in an embodiment. The linear characteristics shown in FIGS. 10A, 10B, and 10C correspond to those shown in FIGS. 9A, 9B, and 9C, respectively, with the curves 331 and 332 corresponding to the same directions of enablement as curves 321 and 322, respectively. It is seen that a relatively good match is achieved between the simulated linearity characteristics and the measured linearity characteristics.

In some embodiments, the linearity characteristics of a particular DCO design is analyzed (e.g., by computer simulation, or by measurements of the circuit/chip) for both directions of enablement (e.g., 160 and 170 in FIG. 1, or 260 and 270 in FIG. 7) for the programmable capacitors 107, and the direction of enablement having a better linearity characteristics is used as the direction of enablement during operation of the DCO. Note that the direction of enablement having the better linearity characteristics may be different for different DCO designs and different parameters (e.g., inductance, capacitance) for the various components in the DCO.

Figure 11:
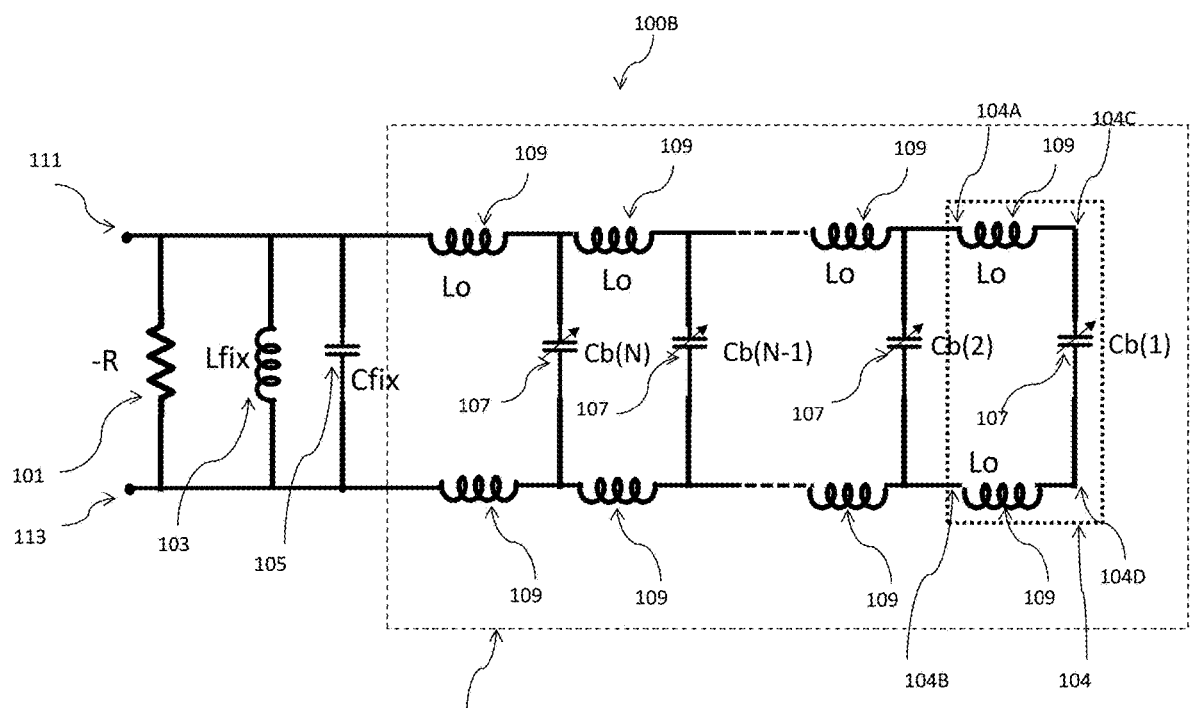
FIG. 11 illustrates a schematic diagram of a digitally controlled oscillator (DCO), in another embodiment.

FIG. 11 illustrates a schematic diagram of a digitally controlled oscillator (DCO) 100B, in another embodiment. The DCO 100B is similar to the DCO 100 of FIG. 1, but with an additional inductor 109 in each of the cells 104. In particular, each cell 104 includes two inductors 109 having a same inductance Lo. The programmable capacitor 107 in each cell 104 is coupled between the node 104C and the node 104D, a first one of the inductors 109 is coupled between the node 104A and the node 104C, and the second one of the inductors 109 is coupled between the node 104B and the node 104D. In some embodiments, the DCO 100B is used to provide a differential output between the output terminals 111 and 113. In contrast, the DCO 100 may be used to provide a single-ended output between the output terminals 111 and 113. For example, in FIG. 1, the output terminal 113 may be connected to electrical ground, while the output terminal 111 may be used to provide the single-ended output signal. To modify Equations (1)-(4) describe above for the DCO 100B, the inductance Lo in the equations should be replaced by 2×Lo, due to the additional inductor 109 in the cell 104 of the DCO 100B.

Figure 12:
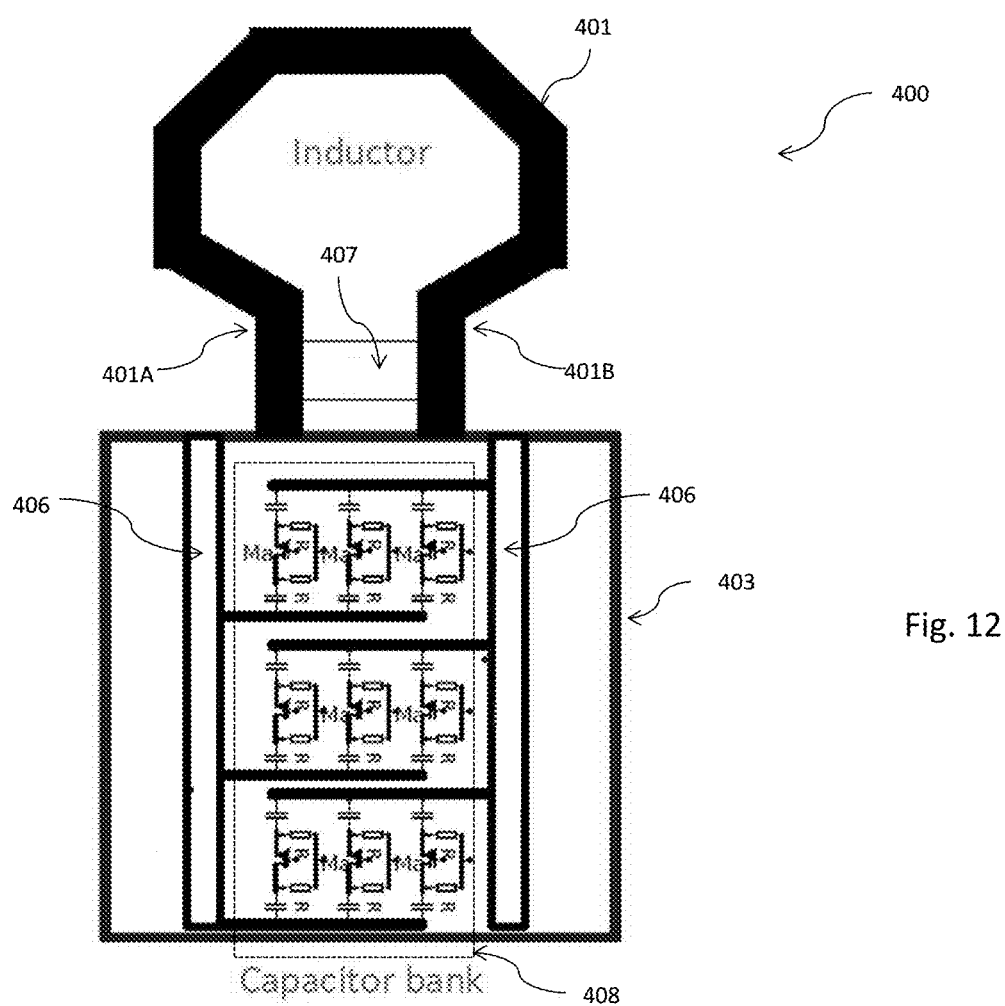
FIG. 12 illustrate a design for a digitally controlled oscillator, in an embodiment.

FIG. 12 illustrates a design for a digitally controlled oscillator (DCO) 400, in an embodiment. The DCO 400 may correspond to the DCO 100B of FIG. 11, with the programmable capacitors 107 being implemented as the example shown in FIG. 4. In the example of FIG. 12, the fixed capacitor Cfix (see FIG. 1) is omitted.

Figure 13:
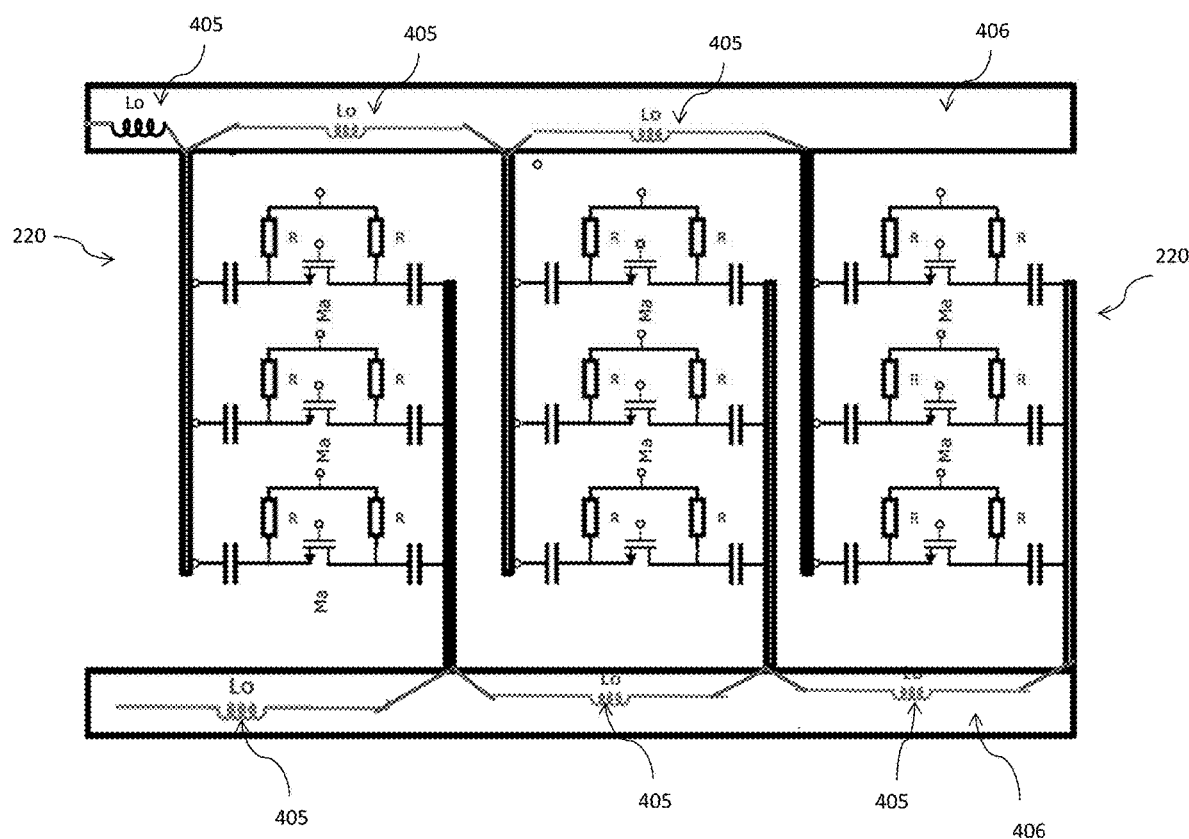
FIG. 13 illustrates a zoomed-in view of a portion of the design of FIG. 12.

As illustrated in FIG. 12, the DCO 400 includes a ring-shaped inductor 401, an active device 407 coupled between terminals 401A and 401B of the inductor 401. The DCO 400 further includes a substrate 403 (e.g., a semiconductor substrate such as silicon substrate), metal bars 406, and a programmable capacitor bank 408 coupled between the metal bars 406. The metal bars 406 are coupled between a first end and a second end of the ring-shaped inductor 401. In some embodiments, the inductor 401 is referred to as a U-shaped inductor 401. FIG. 13 illustrates a zoomed-in view of a portion of the DCO 400 comprising the programmable capacitor bank 408.

FIG. 13 shows the metal bars 406 and a plurality of programmable capacitors 220 (see also FIG. 4) coupled between the metal bars 406. FIG. 13 also illustrates a plurality of inductors 405 having an inductance of Lo. Note that the inductors 405 in FIG. 13 represent the equivalent inductance of a respective portion of the metal bars 406, where the dimension of the metal bar 406, as well as the distance between adjacent programmable capacitors 220, have been designed to achieve a target inductance (e.g., Lo). The equivalent inductance La may be in a same range as the inductor 109 of FIG. 1.

Figure 14:
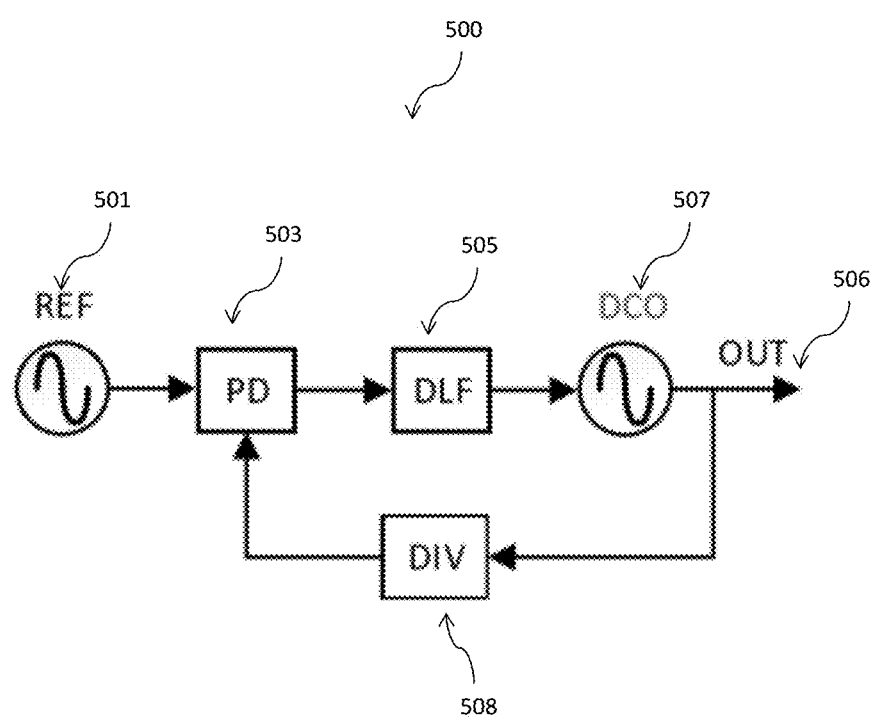
FIG. 14 illustrates a block diagram of a phase lock loop, in an embodiment.

FIG. 14 illustrates a block diagram of a phase lock loop (PLL) 500, in an embodiment. The PLL 500 includes a reference frequency source 501, a phase detector 503, a digital loop filter 505, a DCO 507, and a frequency divider 508. The DCO 507 may be any of the DCOs disclosed herein, such as the DCO 100, 100A, or 100B. The output of the DCO 507 is divided to generate a lower frequency signal, which is then compared with the reference frequency source 501 by the phase detector 503 to generate a phase error. The phase error is then filtered by the digital loop filter 505 to drive the DCO 507. Note that the PLL 500 is just an example application of the disclosed DCOs. The various embodiment DCOs disclosed herein may also be used without a PLL (e.g., as a stand-alone DCO to provide an output frequency defined the digital control word).

Figure 15:
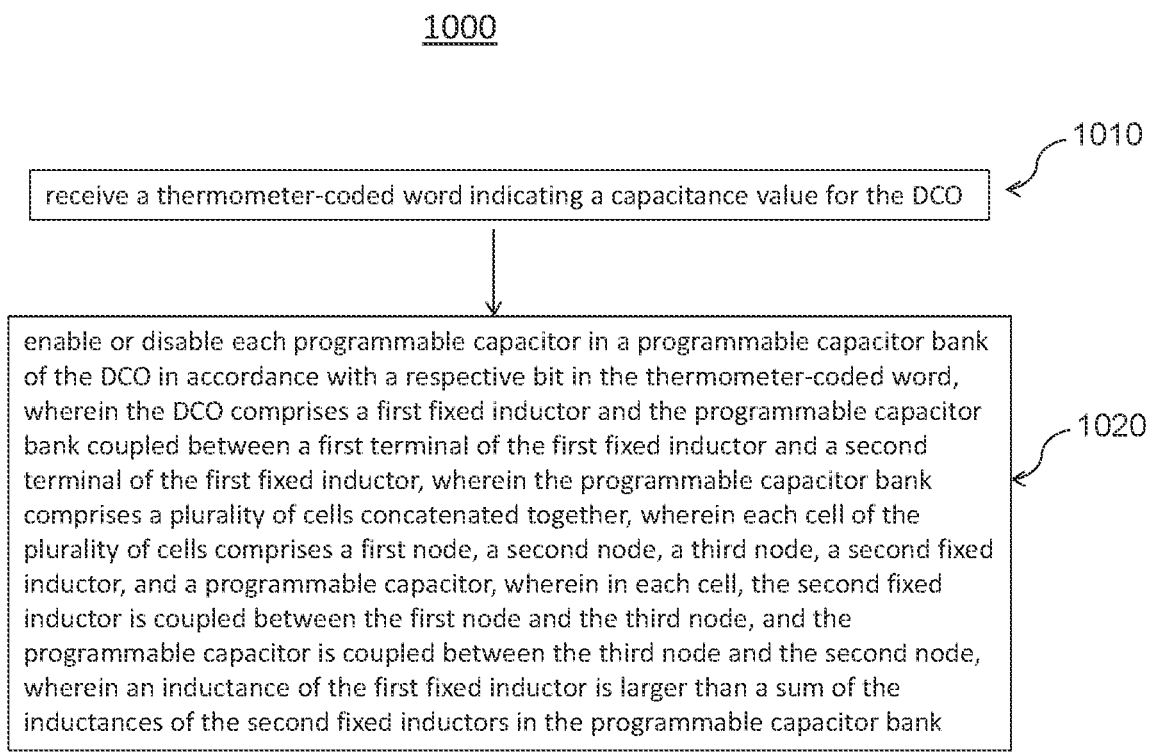
FIG. 15 illustrates a flow chart for a method of operating a digitally controlled oscillator, in some embodiments.

FIG. 15 illustrates a flow chart for a method 1000 of operating a digitally controlled oscillator, in some embodiments. It should be understood that the embodiment method shown in FIG. 15 is merely an example of many possible embodiment methods. One of ordinary skill in the art would recognize many variations, alternatives, and modifications. For example, various steps as illustrated in FIG. 15 may be added, removed, replaced, rearranged, or repeated.

Referring to FIG. 15, at block 1010, a thermometer-coded word indicating a capacitance value for the DCO is received. At block 1020, each programmable capacitor in a programmable capacitor bank of the DCO is enabled or disabled in accordance with a respective bit in the thermometer-coded word, wherein the DCO comprises a first fixed inductor and the programmable capacitor bank coupled between a first terminal of the first fixed inductor and a second terminal of the first fixed inductor, wherein the programmable capacitor bank comprises a plurality of cells concatenated together, wherein each cell of the plurality of cells comprises a first node, a second node, a third node, a second fixed inductor, and a programmable capacitor, wherein in each cell, the second fixed inductor is coupled between the first node and the third node, and the programmable capacitor is coupled between the third node and the second node, wherein an inductance of the first fixed inductor is larger than a sum of the inductances of the second fixed inductors in the programmable capacitor bank.

Embodiment may achieve advantages. The various embodiments DCOs include cells that have the inductor 109 and the programmable capacitor 107, which results in a total capacitance of the programmable capacitor bank having polynomial terms to compensate for the square-root law. As a result, a substantially linear relationship between the digital control word and the output frequency of the DCO is achieved. By implementing the programmable capacitor 107 in each cell 104 as a plurality of parallel connected programmable capacitors 210, the frequency resolution of the DCO is improved. As another example, the dual-coil DCO provides improved phase noise performance and improved frequency resolution.

Example embodiments of the present invention are summarized here. Other embodiments can also be understood from the entirety of the specification and the claims filed herein.

Example 1

In an embodiment, an oscillator includes: a first inductor; and a programmable capacitor bank coupled between a first terminal of the first inductor and a second terminal of the first inductor, wherein the programmable capacitor bank comprises a plurality of cells concatenated together, wherein each cell of the plurality of cells comprises a first node, a second node, a third node, a second inductor, and a programmable capacitor, wherein the second inductor is coupled between the first node and the third node, and the programmable capacitor is coupled between the third node and the second node, wherein a first inductance of the first inductor is larger than a sum of the inductances of the second inductors of the programmable capacitor bank.

Example 2

The oscillator of Example 1, wherein the first inductor and the second inductor are fixed inductors.

Example 3

The oscillator of Example 2 or Example 1, wherein the plurality of cells have a same structure.

Example 4

The oscillator of Example 3, wherein the first node of a first cell of the plurality of cells is coupled to the first terminal of the first inductor, and the second node of the first cell is coupled to the second terminal of the first inductor, wherein the first node of a second cell of the plurality of cells is coupled to a first terminal of the programmable capacitor of the first cell, and the second node of the second cell is coupled to a second terminal of the programmable capacitor of the first cell.

Example 5

The oscillator of Example 4, further comprising a fourth inductor coupled in parallel with the programmable capacitor of the second cell, wherein the fourth inductor is a same as the first inductor.

Example 6

The oscillator of Example 5, further comprising: a first active device coupled in parallel with the first inductor; and a second active device coupled in parallel with the fourth inductor.

Example 7

The oscillator of Example 1 or Example 2, wherein the programmable capacitor comprises a first programmable capacitor structure, wherein the first programmable capacitor structure comprises: a first fixed capacitor coupled between a first terminal of the first programmable capacitor structure and a fourth node; a second fixed capacitor coupled between a second terminal of the first programmable capacitor structure and a fifth node; and a programmable switch coupled between the fourth node and the fifth node of the first programmable capacitor structure.

Example 8

The oscillator of Example 7, wherein the first programmable capacitor structure further comprises: a first resistor coupled between the fourth node and a sixth node of the first programmable capacitor structure; and a second resistor coupled between the fifth node and the sixth node of the first programmable capacitor structure, wherein the programmable switch is configured to be controlled by a first control signal, wherein the sixth node is configured to be coupled to a second control signal, wherein the second control signal is an inverse of the first control signal.

Example 9

The oscillator of Example 7, wherein the programmable capacitor further comprises a second programmable capacitor structure coupled in parallel to the first programmable capacitor structure, wherein the first programmable capacitor structure and the second programmable capacitor structure have a same structure.

Example 10

The oscillator of Example 1 or Example 2, wherein each cell of the plurality of cells further comprises a third inductor, wherein the third inductor is coupled between the second node and the programmable capacitor.

Example 11

The oscillator of Example 1 or Example 2, further comprising an active device coupled in parallel with the first inductor.

Example 12

In an embodiment, an oscillator includes: a first fixed inductor; and a programmable capacitor bank coupled between a first terminal of the first fixed inductor and a second terminal of the first fixed inductor, wherein the programmable capacitor bank comprises: a first cell, wherein a first node of the first cell is coupled to the first terminal of the first fixed inductor, and a second node of the first cell is coupled to the second terminal of the first fixed inductor, wherein a second fixed inductor of the first cell is coupled between the first node of the first cell and a third node of the first cell, and a first programmable capacitor of the first cell is coupled between the third node of the first cell and the second node of the first cell; and a second cell, wherein a first node of the second cell is coupled to a first terminal of the first programmable capacitor of the first cell, and a second node of the second cell is coupled to a second terminal of the first programmable capacitor of the first cell, wherein a third fixed inductor of the second cell is coupled between the first node of the second cell and a third node of the second cell, and a second programmable capacitor of the second cell is coupled between the third node of the second cell and the second node of the second cell, wherein an inductance of the first fixed inductor is larger than a sum of a second inductance of the second fixed inductor and a third inductance of the third fixed inductor.

Example 13

The oscillator of Example 12, wherein the first cell and the second cell have a same structure.

Example 14

The oscillator of Example 12, wherein the second inductance of the second fixed inductor is a same as the third inductance of the third fixed inductor, wherein the first programmable capacitor and the second programmable capacitor have a same minimum capacitance and a same maximum capacitance.

Example 15

The oscillator of Example 12 or Example 14, wherein the first programmable capacitor of the first cell comprises a first number of programmable capacitor structures coupled in parallel, and the second programmable capacitor of the second cell comprises the first number of programmable capacitor structures coupled in parallel.

Example 16

The oscillator of Example 12 or Example 13, wherein the first cell further comprises a fourth fixed inductor, wherein the first programmable capacitor is coupled between the second fixed inductor and the fourth fixed inductor, wherein the second cell further comprises a fifth fixed inductor, wherein the second programmable capacitor is coupled between the third fixed inductor and the fifth fixed inductor.

Example 17

The oscillator of Example 16, wherein the first fixed inductor has a first inductance, wherein the second fixed inductor, the third fixed inductor, the fourth fixed inductor, and the fifth fixed inductor have a second inductance different from the first inductance.

Example 18

In an embodiment, a method of operating a digitally controlled oscillator (DCO) includes: receiving a thermometer-coded word indicating a capacitance value for the DCO; and enabling or disabling each programmable capacitor in a programmable capacitor bank of the DCO in accordance with a respective bit in the thermometer-coded word, wherein the DCO comprises a first fixed inductor and the programmable capacitor bank coupled between a first terminal of the first fixed inductor and a second terminal of the first fixed inductor, wherein the programmable capacitor bank comprises a plurality of cells concatenated together, wherein each cell of the plurality of cells comprises a first node, a second node, a third node, a second fixed inductor, and a programmable capacitor, wherein in each cell, the second fixed inductor is coupled between the first node and the third node, and the programmable capacitor is coupled between the third node and the second node, wherein an inductance of the first fixed inductor is larger than a sum of the inductances of the second fixed inductors in the programmable capacitor bank.

Example 19

The method of Example 18, wherein enabling or disabling each programmable capacitor comprises enabling or disabling each programmable capacitor in the programmable capacitor bank sequentially along a capacitor enabling direction, wherein the capacitor enabling direction is along a first direction from a first cell of the plurality of cells to a last cell of the plurality of cells, or along a second direction from the last cell to the first cell, wherein the first cell is closest to the first fixed inductor, and the last cell is furthest from the first fixed inductor.

Example 20

The method of Example 18, wherein the first fixed inductor is coupled to the first node and the second node of a first cell of the plurality of cells closest to the first fixed inductor, wherein the DCO further comprises a third fixed inductor coupled in parallel to the programmable capacitor of a last cell of the plurality of cells furthest from the first fixed inductor, wherein the programmable capacitor bank is coupled between the first fixed inductor and the third fixed inductor, wherein enabling or disabling each programmable capacitor comprises: enabling or disabling the programmable capacitors in the programmable capacitor bank sequentially from the first cell and the last cell of the programmable capacitor bank toward a middle section of the programmable capacitor bank; or enabling or disabling the programmable capacitors in the programmable capacitor bank sequentially from the middle section of the programmable capacitor bank toward the first cell and the last cell of the programmable capacitor bank.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An oscillator comprising:
a first inductor, and
a programmable capacitor bank coupled between a first terminal of the first inductor and a second terminal of the first inductor, wherein the programmable capacitor bank comprises a plurality of cells concatenated together, wherein each cell of the plurality of cells comprises a first node, a second node, a third node, a second inductor, and a programmable capacitor, wherein the second inductor is coupled between the first node and the third node, and the programmable capacitor is coupled between the third node and the second node, wherein the second inductor is designed to have a nominal inductance value, wherein a first inductance of the first inductor is larger than a sum of the nominal inductance values of the second inductors of the programmable capacitor bank.

2. The oscillator of claim 1, wherein the first inductor and the second inductor are fixed inductors.

3. The oscillator of claim 2, wherein the plurality of cells have a same structure.

4. The oscillator of claim 3, wherein the first node of a first cell of the plurality of cells is coupled to the first terminal of the first inductor, and the second node of the first cell is coupled to the second terminal of the first inductor, wherein the first node of a second cell of the plurality of cells is coupled to a first terminal of the programmable capacitor of the first cell, and the second node of the second cell is coupled to a second terminal of the programmable capacitor of the first cell.

5. The oscillator of claim 4, further comprising:
a fourth inductor coupled in parallel with the programmable capacitor of the second cell, wherein the fourth inductor is a same as the first inductor.

6. The oscillator of claim 5, further comprising:
a first active device coupled in parallel with the first inductor; and a second active device coupled in parallel with the fourth inductor.

7. The oscillator of claim 1, wherein the programmable capacitor comprises a first programmable capacitor structure, wherein the first programmable capacitor structure comprises:
   a first fixed capacitor coupled between a first terminal of the first programmable capacitor structure and a fourth node;
   a second fixed capacitor coupled between a second terminal of the first programmable capacitor structure and a fifth node; and
   a programmable switch coupled between the fourth node and the fifth node of the first programmable capacitor structure.

8. The oscillator of claim 7, wherein the first programmable capacitor structure further comprises:
   a first resistor coupled between the fourth node and a sixth node of the first programmable capacitor structure; and
   a second resistor coupled between the fifth node and the sixth node of the first programmable capacitor structure, wherein the programmable switch is configured to be controlled by a first control signal, wherein the sixth node is configured to be coupled to a second control signal, wherein the second control signal is an inverse of the first control signal.

9. The oscillator of claim 7, wherein the programmable capacitor further comprises a second programmable capacitor structure coupled in parallel to the first programmable capacitor structure, wherein the first programmable capacitor structure and the second programmable capacitor structure have a same structure.

10. The oscillator of claim 1, wherein each cell of the plurality of cells further comprises a third inductor, wherein the third inductor is coupled between the second node and the programmable capacitor.

11. The oscillator of claim 1, further comprising an active device coupled in parallel with the first inductor.

12. An oscillator comprising:
   a first fixed inductor, and
   a programmable capacitor bank coupled between a first terminal of the first fixed inductor and a second terminal of the first fixed inductor, wherein the programmable capacitor bank comprises:
      a first cell, wherein a first node of the first cell is coupled to the first terminal of the first fixed inductor, and a second node of the first cell is coupled to the second terminal of the first fixed inductor, wherein a second fixed inductor of the first cell is coupled between the first node of the first cell and a third node of the first cell, and a first programmable capacitor of the first cell is coupled between the third node of the first cell and the second node of the first cell; and
      a second cell, wherein a first node of the second cell is coupled to a first terminal of the first programmable capacitor of the first cell, and a second node of the second cell is coupled to a second terminal of the first programmable capacitor of the first cell, wherein a third fixed inductor of the second cell is coupled between the first node of the second cell and a third node of the second cell, and a second programmable capacitor of the second cell is coupled between the third node of the second cell and the second node of the second cell, wherein each of the second fixed inductor and the third fixed inductor is designed to have a nominal inductance value, wherein an inductance of the first fixed inductor is larger than a sum of a second nominal inductance value of the second fixed inductor and a third nominal inductance value of the third fixed inductor.

13. The oscillator of claim 12, wherein the first cell and the second cell have a same structure.

14. The oscillator of claim 12, wherein the second nominal inductance value of the second fixed inductor is a same as the third nominal inductance value of the third fixed inductor, wherein the first programmable capacitor and the second programmable capacitor have a same minimum capacitance and a same maximum capacitance.

15. The oscillator of claim 12, wherein the first programmable capacitor of the first cell comprises a first number of programmable capacitor structures coupled in parallel, and the second programmable capacitor of the second cell comprises the first number of programmable capacitor structures coupled in parallel.

16. The oscillator of claim 12, wherein the first cell further comprises a fourth fixed inductor, wherein the first programmable capacitor is coupled between the second fixed inductor and the fourth fixed inductor, wherein the second cell further comprises a fifth fixed inductor, wherein the second programmable capacitor is coupled between the third fixed inductor and the fifth fixed inductor.

17. The oscillator of claim 16, wherein the first fixed inductor has a first inductance, wherein the second fixed inductor, the third fixed inductor, the fourth fixed inductor, and the fifth fixed inductor have a second inductance different from the first inductance.

18. A method of operating a digitally controlled oscillator (DCO), the method comprising:
   receiving a thermometer-coded word indicating a capacitance value for the DCO; and
   enabling or disabling each programmable capacitor in a programmable capacitor bank of the DCO in accordance with a respective bit in the thermometer-coded word, wherein the DCO comprises a first fixed inductor and the programmable capacitor bank coupled between a first terminal of the first fixed inductor and a second terminal of the first fixed inductor, wherein the programmable capacitor bank comprises a plurality of cells concatenated together, wherein each cell of the plurality of cells comprises a first node, a second node, a third node, a second fixed inductor, and a programmable capacitor, wherein in each cell, the second fixed inductor is coupled between the first node and the third node, and the programmable capacitor is coupled between the third node and the second node, wherein an inductance of the first fixed inductor is larger than a sum of the inductances of the second fixed inductors in the programmable capacitor bank.

19. The method of claim 18, wherein enabling or disabling each programmable capacitor comprises enabling or disabling each programmable capacitor in the programmable capacitor bank sequentially along a capacitor enabling direction, wherein the capacitor enabling direction is along a first direction from a first cell of the plurality of cells to a last cell of the plurality of cells, or along a second direction from the last cell to the first cell, wherein the first cell is closest to the first fixed inductor, and the last cell is furthest from the first fixed inductor.

20. The method of claim 18, wherein the first fixed inductor is coupled to the first node and the second node of a first cell of the plurality of cells closest to the first fixed inductor, wherein the DCO further comprises a third fixed inductor coupled in parallel to the programmable capacitor of a last cell of the plurality of cells furthest from the first fixed inductor, wherein the programmable capacitor bank is coupled between the first fixed inductor and the third fixed inductor, wherein enabling or disabling each programmable capacitor comprises:

enabling or disabling the programmable capacitors in the programmable capacitor bank sequentially from the first cell and the last cell of the programmable capacitor bank toward a middle section of the programmable capacitor bank; or enabling or disabling the programmable capacitors in the programmable capacitor bank sequentially from the middle section of the programmable capacitor bank toward the first cell and the last cell of the programmable capacitor bank.

* * * * *